United States Patent [19]

Ishikawa et al.

[11] Patent Number: 5,759,668
[45] Date of Patent: Jun. 2, 1998

[54] HEAT SEAL STRUCTURE

[75] Inventors: Tatsuro Ishikawa, Otsu; Hiroyuki Sagawa; Kiyoji Inoue, both of Moriyama; Tetsuo Shinkai, Yamaga; Atsushi Kamizasa, Otsu, all of Japan

[73] Assignee: Omron Corporation, Kyoto, Japan

[21] Appl. No.: 824,437

[22] Filed: Mar. 26, 1997

Related U.S. Application Data

[63] Continuation of Ser. No. 383,492, Feb. 3, 1995, abandoned.

[30] Foreign Application Priority Data

Feb. 4, 1994 [JP] Japan ................ 6-012499
Feb. 4, 1994 [JP] Japan ................ 6-012501

[51] Int. Cl.⁶ ............................ H05K 5/06; B32B 3/24
[52] U.S. Cl. .......................... 428/137; 428/156; 428/131; 428/139; 428/119; 428/913; 53/403; 53/404; 220/361; 220/363; 220/364; 174/50.58; 335/202
[58] Field of Search ..................... 428/137, 156, 428/131, 139, 119, 913; 53/403, 404; 220/361, 363, 364; 174/50.58; 335/202

[56] References Cited

U.S. PATENT DOCUMENTS

| | | | |
|---|---|---|---|
| 2,476,387 | 7/1949 | Roovers | 220/2.2 |
| 3,489,266 | 1/1970 | Miller | 206/524.5 |
| 3,769,135 | 10/1973 | Wallington | 156/306 |
| 4,478,788 | 10/1984 | Rozmus et al. | 419/48 |
| 4,482,053 | 11/1984 | Alpern et al. | 206/439 |
| 4,544,078 | 10/1985 | Arenas et al. | 220/256 |
| 4,675,987 | 6/1987 | Minks et al. | 29/602.1 |
| 4,831,348 | 5/1989 | Agatahama et al. | 335/80 |
| 5,184,102 | 2/1993 | Muller | 335/202 |
| 5,307,985 | 5/1994 | Beizermann | 229/120 |
| 5,477,008 | 12/1995 | Pasqualoni et al. | 174/52.3 |

*Primary Examiner*—William P. Watkins, III
*Attorney, Agent, or Firm*—Morrison & Foerster LLP

[57] ABSTRACT

The invention provides an improved heat seal structure for electronic devices. A heat seal structure comprises a base of synthetic resin formed integrally with an outwardly extending projection, with a gas vent running through the base and projection, the gas vent being sealed off by melting the projection, the improvement that the gas vent is configured generally in the shape of the letter V or Y bifurcating in the outward direction. In another embodiment, the projection has an annular extension disposed on the outward side of the base and adapted to be melted for a double seal effect. In another version of the structure, heat-sealing is performed with a sealing member or composition interposed in the gas vent. In still further embodiments, heat sealing is performed using a sealing member melting at a temperature below the melting point of the resin forming the base.

1 Claim, 13 Drawing Sheets

(PRIOR ART)

(PRIOR ART)

HEAT SEAL STRUCTURE

This application is a continuation of United States application Ser. No. 08/383,492, filed Feb. 3, 1995, now abandoned.

FIELD OF THE INVENTION

The present invention relates to a heat seal structure and more particularly to a heat seal structure for electronic devices such as sealed relays and switches.

BACKGROUND OF THE INVENTION

The conventional heat seal structure for a sealed relay or the like comprises, as illustrated in FIGS. 26 and 27 of the accompanying drawings, a base 1 and a projection 2 extending outwardly of said base with a gas vent 3 running through said base and projection and having a generally V-shaped, inwardly expanding sectional configuration, the gas vent 3 having been closed by melting the projection 2 by means of a heat sealer tip.

This conventional heat seal structure has the drawback that because of the comparatively large diameter of the gas vent 3, the molten resin of the projection 2 hungs down centrally from the seal 5 to considerably reduce the thickness of the seal 5. Therefore, when the sealed device, e.g. relay, is mounted on a printed circuit board by soldering, the thermal stress of the molten solder tends to destroy the seal 5, thus failing to provide a hermetic seal.

Moreover, unless the heat sealer tip is accurately positioned, a variation in the thickness of the seal 5 and, hence, in the sealing effect is inevitable. Insuring a positioning accuracy of the heat sealer tip 4 is a time-consuming procedure and detracts from productivity.

A further disadvantage of the conventional heat seal structure is that when the gas vent 3 is closed by melting the resin projection 2, a portion of the molten to resin spreads out of the hat sealer tip 4 to form a fin 6a around the seal 5 and a further portion of the molten resin hungs down through the vent 3 to form an unsightly fin 6b on the underside of the seal 5. this underside fin 6b is unstable, too, and if an external impact force acts on the fin 6b, the fin 6b is easily severed from the base 1 and contacts the internal components and thereby cause a malfunction of the electronic device.

For these reasons, an improved structure has been proposed, which, as shown in FIGS. 28 and 29, includes an annular groove 7 around the base of the projection 2 so that after the gas vent 3 is closed by the seal 5 formed on melting of the projection 2 with a heat sealer tip 4, a sealing agent 9 is introduced and allowed to solidify in the recess 8 formed on heat sealing to provide a double seal.

However, this seal structure also has the drawback that in addition to the inability to preclude formation of the fin 6b, the sealing agent 9 must be filled into the recess 8 and this additional step detracts from productivity. Particularly in the event cracks have developed in the seal 5, the organic gas evolved from the sealing agent 9 finds its way into the housing to corrode the internal contact points and, thereby, cause a contact failure.

OBJECTS AND SUMMARY OF THE INVENTION

The object of this invention is to provide a heat seal structure which is uniform in sealing effect, conducive to high productivity and virtually insured against malfunction.

Other objects and advantageous features of this invention will become apparent from the following description taken together with the accompanying drawings.

Embodiment 1 (FIG. 1, FIG. 2)

A heat seal structure comprising a base of synthetic resin formed integrally with an outwardly extending projection with a gas vent running through the base and the projection, the projection being meltable to seal off the gas vent, the gas vent being configured generally in the shape of the letter V bifurcating in the outward direction.

Embodiment 2 (FIG. 3, FIG. 4)

A heat seal structure comprising a base of synthetic resin formed integrally with an outwardly extending projection with a gas vent running through the base and the projection, the projection being meltable to seal off the gas vent, the gas vent being configured generally in the shape of the letter Y bifurcating in the outward direction.

Embodiment 3 (FIG. 5, FIG. 6)

A heat seal structure comprising a base of synthetic resin formed integrally with an outwardly extending projection with a gas vent running through the base and the projection, the projection being meltable to seal off the gas vent, the projection having an annular extension forming an outward aperture of the gas vent, the annular projection being adapted to be melted to provide a double seal.

Embodiment 4 (FIG. 7, FIG. 8)

A heat seal structure comprising a base of synthetic resin formed integrally with an outwardly extending projection with a gas vent running through the base and the projection, the projection being meltable to seal off the gas vent, the gas vent being heat-sealable along with a sealing member inserted partway therein.

Embodiment 5 (FIG. 9, FIG. 10)

A heat seal structure comprising a base of synthetic resin formed integrally with an outwardly extending projection with a gas vent running through the base and the projection, the projection being meltable to seal the gas vent, the gas vent being heat-sealed along with a sealing composition filled therein and allowed to solidify in situ.

Embodiment 6 (FIG. 11, FIG. 12, FIG. 13, FIG. 14, FIG. 15)

A heat seal structure comprising a base of synthetic resin formed integrally with an outwardly extending projection with a gas vent running through the base and the projection, the projection being meltable to seal off the gas vent, the gas vent being heat-sealable along with a synthetic resin sealing member having a melting temperature below the melting point of the synthetic resin constituting the base.

Embodiment 7 (FIG. 17, FIG. 18)

A heat seal structure comprising a base of synthetic resin formed integrally with an outwardly extending projection with a gas vent running through the base and the projection, the projection being meltable to seal off the gas vent, the base being provided with an integral annular projection around the projection, the annular projection being thermally meltable to provide a double seal.

Embodiment 8 (FIG. 19, FIG. 20, FIG. 21)

A heat seal structure comprising a base of synthetic resin formed integrally with an outwardly extending projection with a gas vent running through the base and the projection, said projection being meltable to seal off the gas vent, and a sealing member molded one-piece with the base in a position traversing the gas vent and having a through-hole disposed to communicate with the gas vent and being smaller than the gas vent in cross-sectional area, the through hole of the sealing member being sealable upon thermal melting of the projection.

Embodiment 9 (FIG. 22, FIG. 23)

A heat seal structure comprising a base of synthetic resin formed integrally with an outwardly extending projection with a gas vent running through the base and the projection, the projection being meltable to seal off the gas vent, and a sealing member molded integrally with the base so as to cover an inward aperture of the gas vent, the sealing member defining a through-hole smaller than the gas vent and allowing communication with the gas vent, the through-hole being sealable upon thermal melting of the projection.

Embodiment 10 (FIG. 24, FIG. 25)

A heat seal structure comprising a base of synthetic resin formed integrally with an outwardly extending projection with a gas vent running through the base and the projection, the projection being meltable to seal off the gas vent, and a sealing member molded from a material having a melting temperature below the melting point of the resin constituting the base, the sealing member having been molded one-piece with said base to constitute said projection.

DETAILED DESCRIPTION OF THE PREFERRED EMBODIMENTS

The preferred embodiments of this invention are now described in detail with reference to FIGS. 1 through 25.

Figure 1:
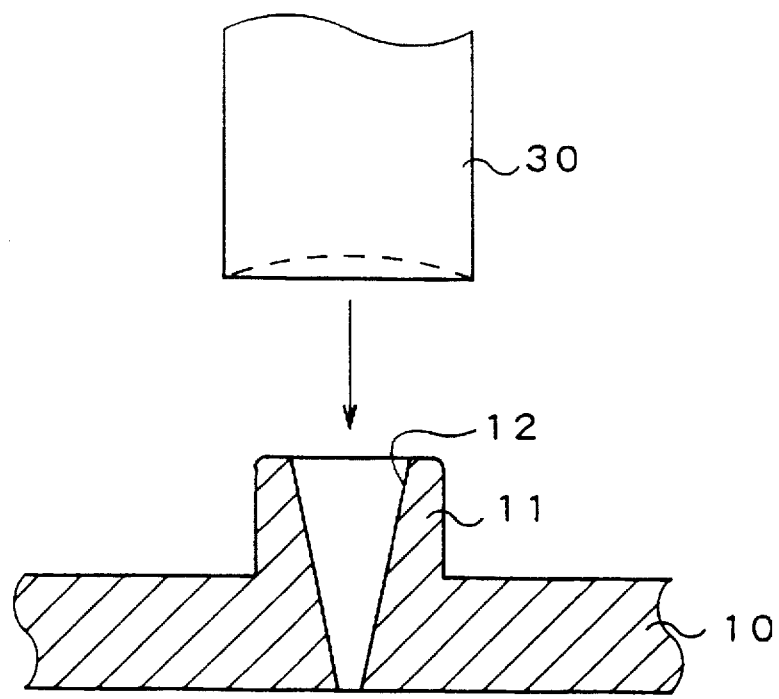
FIG. 1 is a cross-sectional view, on exaggerated scale of the heat seal structure according to a first embodiment of the invention prior to heat sealing.
Figure 2:
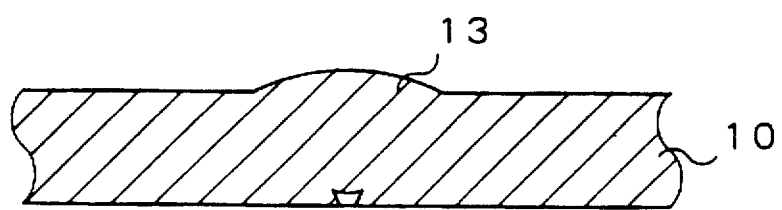
FIG. 2 is an a cross-sectional, on exaggerated scale, of the heat seal structure of FIG. 1 after heat sealing.

As illustrated in FIGS. 1 and 2, the heat seal structure according to the first embodiment of this invention comprises a synthetic resin base 10 formed integrally with an outwardly extending projection 11 with a gas vent 12 running through the base and the projection. The gas vent 12 is configured generally in the shape of the letter V bifurcating the outward direction of the base 10.

In this arrangement, as a heat sealer tip 30 is pressed against the projection 11, a portion of the projection is melted, flows down the tapered wall defining the vent 12 and solidifies there.

Unlike the conventional heat seal structure, this heat seal structure is free from the formation of a fin due to the hanging of molten resin. Instead, the molten resin fills up the gas vent 12 thoroughly to form a thick seal 13.

Figure 20:
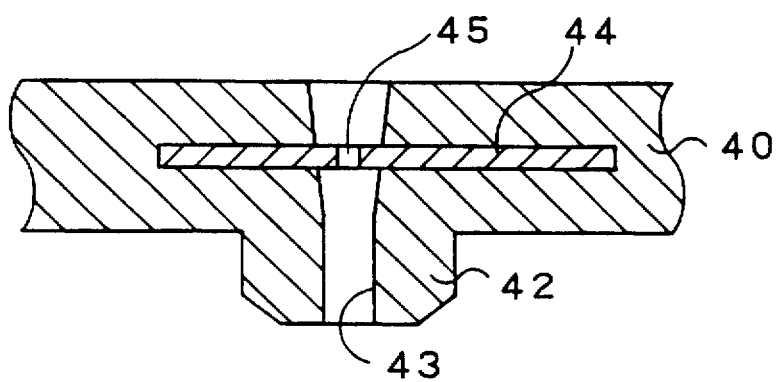
FIG. 20 is a cross-sectional view, on exaggerated scale, of the heat seal structure of FIG. 19 prior to heat sealing.
Figure 21:
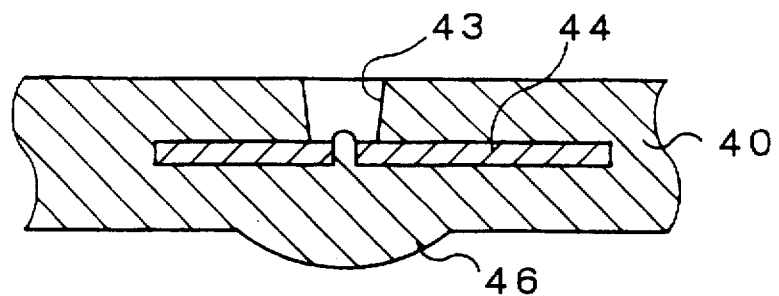
FIG. 21 is a cross-sectional view, on exaggerated scale, of the heat seal structure of FIG. 19 after heat sealing.

Particularly since the gas vent 12 in this embodiment is configured generally in the shape of the letter V in cross-sectional view, the molten projection 11 does not overflow the gas vent 12 but mostly flows smoothly down the tapered wall of the gas vent 12 and solidifies within the vent 12. Therefore, there is no formation of a fin 6b on the inward surface of the base 10 nor is fin 6a formed on the outward surface of the base 10 (FIG. 20). As a result, the heat seal structure of this embodiment is neat-looking and involves no waste of material. Moreover, there is no detachment of fin 6b so that the structure is free of electrical troubles associated with the fin 6b.

These advantages are possessed by the embodiments having a tapered gas vent outwardly expanding as described hereinafter as well.

Figure 3:
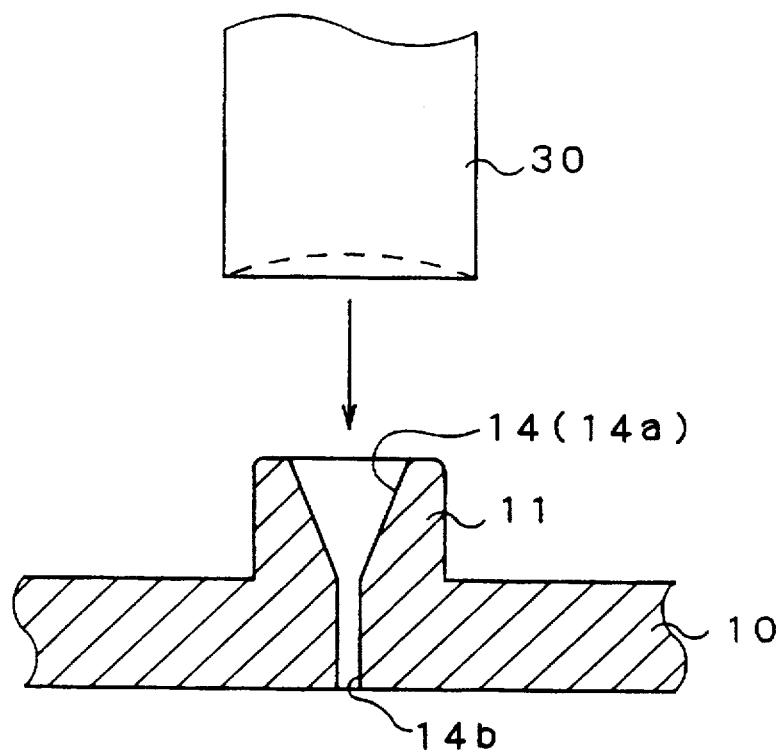
FIG. 3 is a cross sectional view, on exaggerated scale, of the heat seal structure according to a second embodiment prior to heat sealing.
Figure 4:
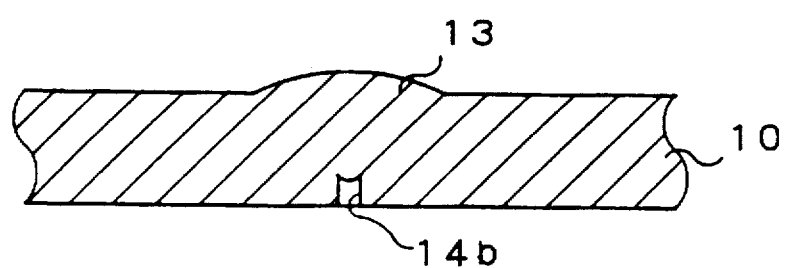
FIG. 4 is a cross-sectional view, on exaggerated scale, of the heat seal structure according to the second embodiment after heat sealing.

The second embodiment of this invention, illustrated in FIGS. 3 and 4, is provided with a gas vent 14 which is configured generally in the shape of the letter Y, in lieu of V, in cross-sectional view. This gas vent 14 generally consists of a tapered portion 14a and a straight portion 14b.

In this second embodiment, just as in the first embodiment described above, pressing a heat sealer tip 30 against the projection 11 causes a melted portion of the projection 11 to flow down the tapered portion 14a of the gas vent 14 and solidify there. Therefore, just as in the first embodiment, there is no formation of a fin of hanging resin but the resin molten fills up the gas vent 12 evenly and thoroughly to insure a thick solid seal 13.

The other details of this embodiment are similar to those of the first embodiment described above and are, therefore, not explained.

Figure 5:
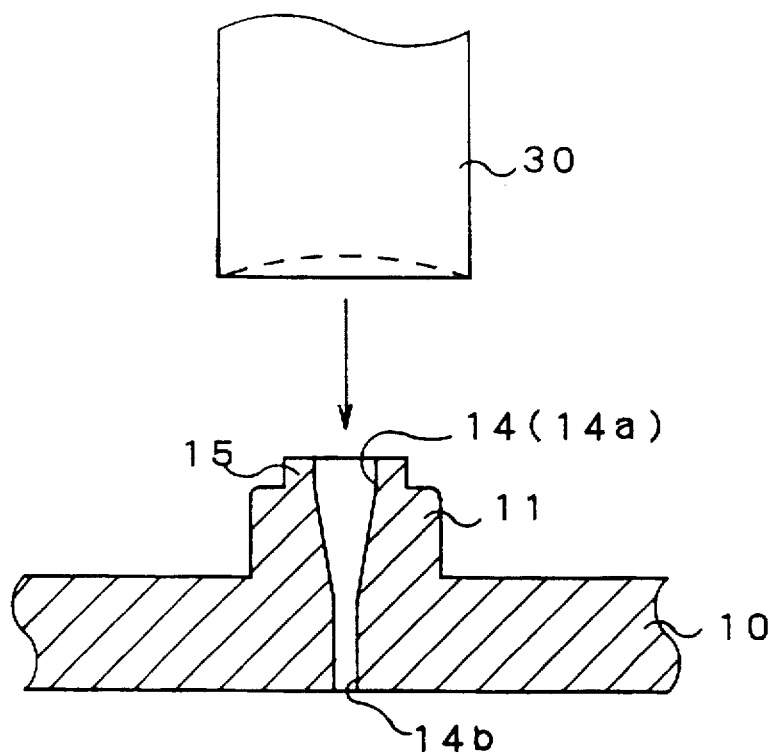
FIG. 5 is a cross-sectional view, on exaggerated scale, of the heat seal structure according to a third embodiment prior to heat sealing.
Figure 6:
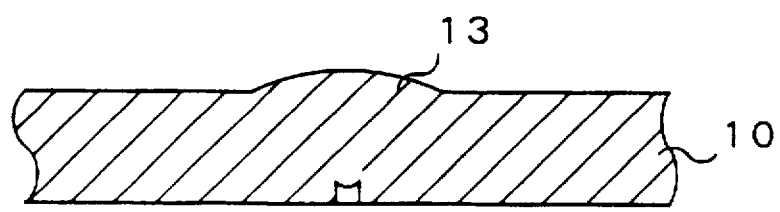
FIG. 6 is a cross-sectional view, on exaggerated scale, of the heat seal structure according to the third embodiment after heat sealing.

The third embodiment of this invention is shown in FIGS. 5 and 6. Whereas the gas vent 14 in the second embodiment is generally Y-shaped in cross-sectional view, this third embodiment is provided with an annular extension 15 around the outward aperture of the gas vent 14.

In this third embodiment, pressing the heat sealer tip 30 against the projection 11 causes the annular extension 15 to melt in the first place and the molten resin flows down the tapered wall 14a of the gas vent 14. Then, the straight portion 14b is filled with a further amount of molten resin to effect a hermetic seal. Therefore, there is no formation of a pendant fin inevitable to the conventional structure and a thick solid seal 13 is obtained.

Particularly because the amount of synthetic resin available for sealing is larger by the amount corresponding to the annular extension 15 in this embodiment, the thickness of the seal 13 is further increased to insure a still improved sealing effect. The other details of the structure are similar to those of the preceding embodiments and are, therefore, not explained.

Figure 7:
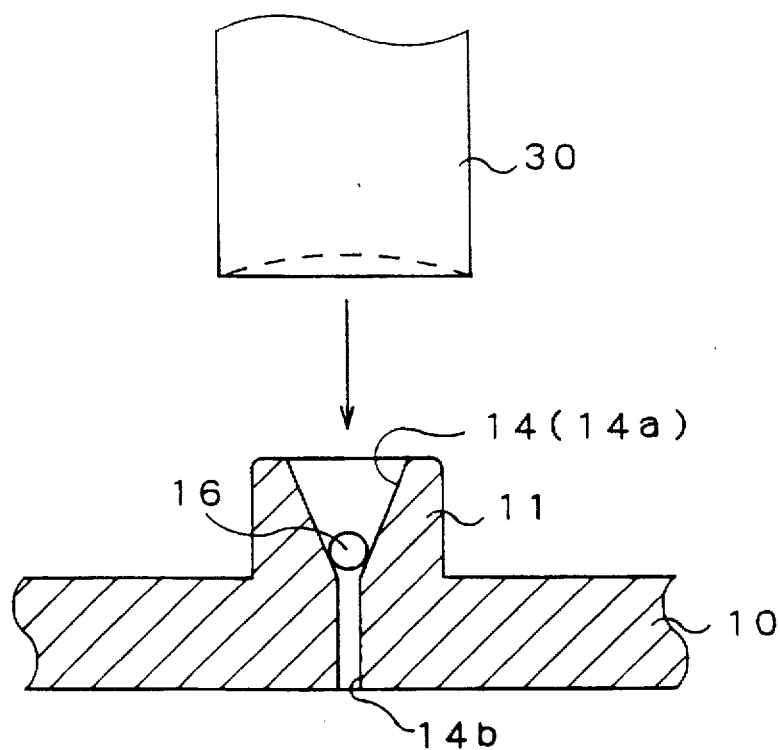
FIG. 7 is a cross-sectional view, on exaggerated scale, of the heat seal structure according to a fourth embodiment prior to heat sealing.
Figure 8:
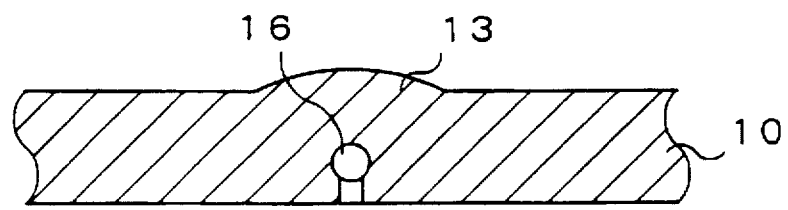
FIG. 8 is a cross-sectional view, on exaggerated scale, of the heat seal structure according to the fourth embodiment after heat sealing.

The fourth embodiment of this invention is illustrated in FIGS. 7 and 8. Whereas the heat seal is solely provided by the base 10 in the foregoing embodiments, this embodiment is characterized in that a sealing member 16 is inserted into the gas vent 14 to make a provisional seal and, then, the heat sealer tip 30 is pressed against the projection 11 to effect a hermetic seal.

In this fourth embodiment, the molten resin flowing through the tapered portion 14a of the gas vent 14 is intercepted by the sealing member 16 and solidifies upstreams thereof so that no pendant fin is produced and a thick solid seal 13 is obtained.

It should be understood that the sealing member 16 for use in this fourth embodiment is not restricted to a spherical element as illustrated but may for example be conical, frustoconical or wedge-shaped and may be made of virtually any material, inclusive of synthetic resin, metal, ceramics and so on. The sectional configuration of the gas vent 14 need not be generally Y-shaped but may be generally V-shaped.

The other details of the heat seal structure according to this embodiment are similar to those of the foregoing embodiments and are, therefore, not explained.

Figure 9:
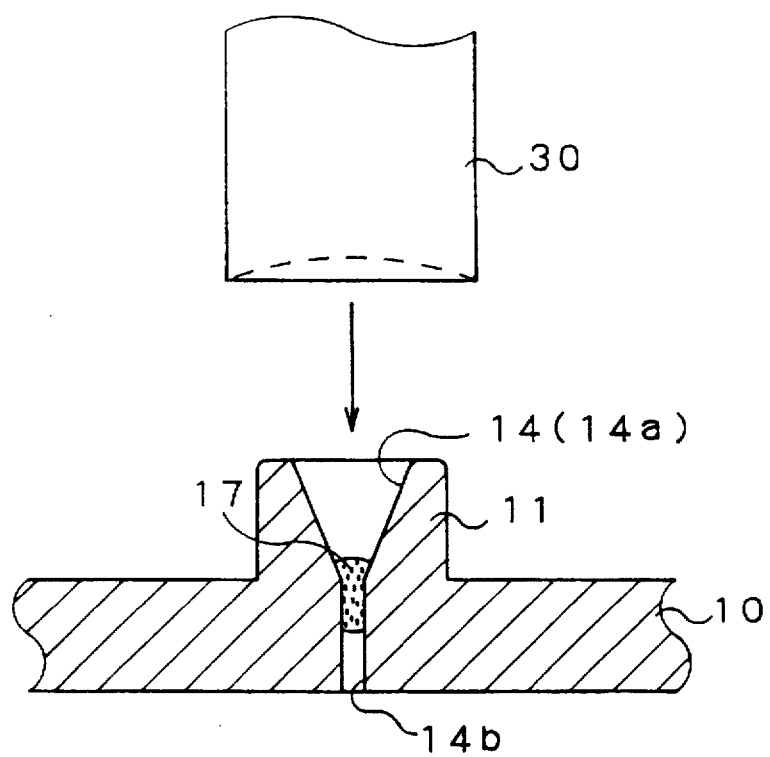
FIG. 9 is a cross-sectional view, on exaggerated scale, of the heat seal structure according to a fifth embodiment prior to heat sealing.
Figure 10:
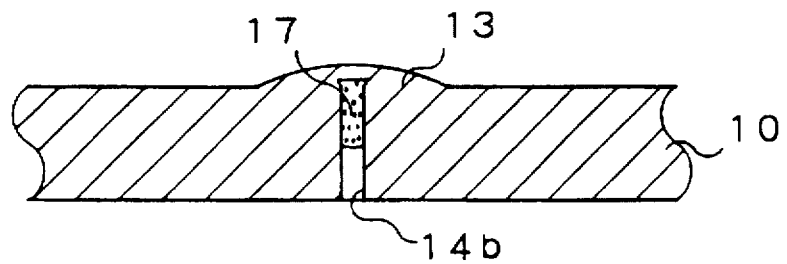
FIG. 10 is a cross-sectional view, on exaggerated scale, of the heat seal structure according to the fifth embodiment after heat sealing.

The fifth embodiment of this invention is illustrated in FIGS. 9 and 10. Whereas the heat seal structure of the fourth embodiment employs a solid sealing member 16, the heat seal structure of this fifth embodiment is characterized in that a liquid sealing composition 17 is filled and allowed to solidify in the gas vent 14 and, then, the heat sealer tip 30 is pressed against said projection 11 to effect a hermetic seal. The sealing composition may for example be a flowable one-component synthetic resin or a flowable two-component synthetic resin.

In accordance with this fifth embodiment, the molten resin flowing through the tapered portion 14a of the gas vent 14 is intercepted by the previously cured sealing composition 17 and allowed to solidify upstreams thereof so that no pendant fin is produced but a thick solid hermetic seal 13 is obtained. Therefore, a substantial double seal effect is realized. The other details are similar to those of the preceding embodiments and are, therefore, not explained.

Figure 11:
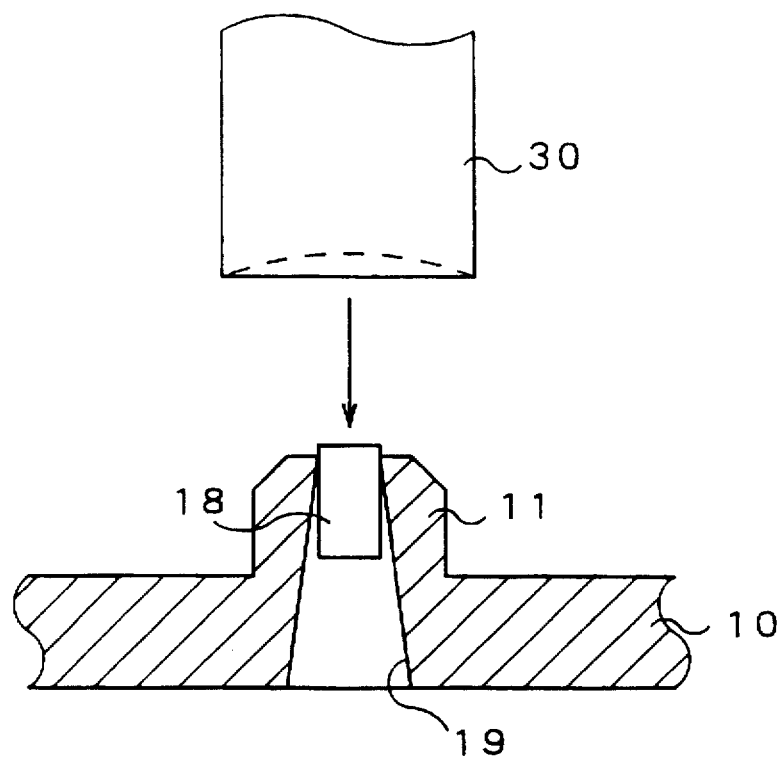
FIG. 11 is a cross-sectional view, on exaggerated scale, of the heat seal structure according to a sixth embodiment prior to heat sealing.
Figure 12:
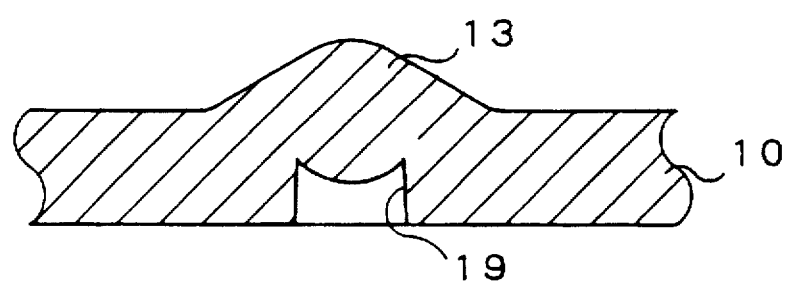
FIG. 12 is a cross-sectional view, on exaggerated scale, of the heat seal structure according to the sixth embodiment after heat sealing.

The sixth embodiment of this invention is illustrated in FIGS. 11 and 12. Whereas the sealing member 16 and sealing composition 17, both of which are not melted at the sealing temperature, are used in the fourth and fifth embodiments, respectively, this sixth embodiment is characterized in that a sealing member 18 made of a synthetic resin melting at a temperature below or equal to the melting point of the resin constituting the base 10 is inserted into the gas vent 19 of the projection 11 and, then, the heat sealer tip 30 is pressed against the projection 11 to effect a hermetic seal.

Since the melting point of the sealing member 18 in this embodiment is lower than or equal to the melting point of the base 10, it is ready to melt and solidify. Therefore, when the heat sealer tip 30 is applied, the sealing member 18 is first melted and solidify and, thereafter, the projection 11 is melted and solidifies so that a substantial double seal is obtained. Moreover, particularly when the sealing member 18 has a lower melting point, the melting time is reduced as compared with the case in which the resin projection having a comparable volume is melted, with the result that productivity is increased. Another advantage is that because the amount of synthetic resin available for sealing is larger by the amount corresponding to the sealing member 18, a more thick solid seal can be obtained.

Figure 13:
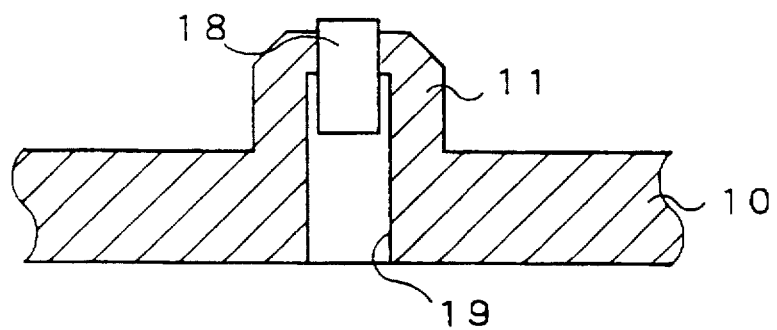
FIG. 13 is a cross-sectional view, on exaggerated scale, of an example of application of the sixth embodiment prior to heat sealing.
Figure 14:
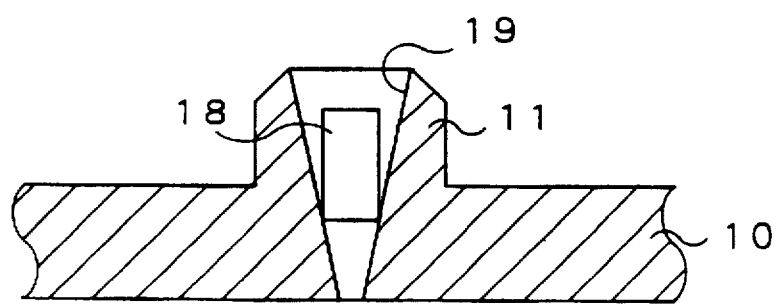
FIG. 14 is a cross-sectional view, on exaggerated scale, of another example of application of the sixth embodiment prior to heat sealing.
Figure 15:
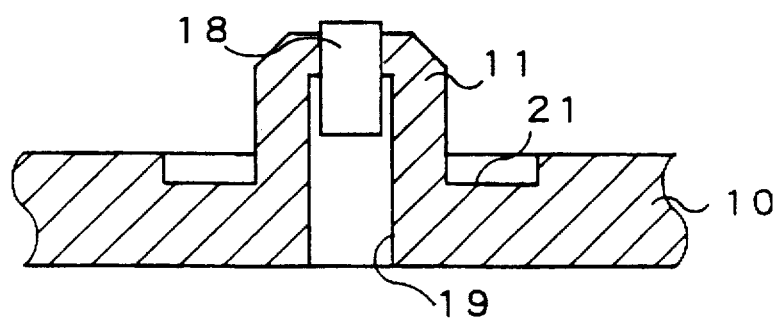
FIG. 15 is a cross-sectional view, on exaggerated scale, of still another example of application of the sixth embodiment prior to heat sealing.

FIGS. 13 through 15 show the sixth embodiment of this invention. FIG. 13 pertains to the case in which the sealing member 18 is forced into the aperture of the gas vent 19; FIG. 14 pertains to the case in which the sealing member 18 is forced in to a vent 19 having a generally V-shaped cross section; and FIG. 15 shows the case in which an annular groove 21 is provided around the root of the projection 11 containing the sealing member 18. The other details are similar to the embodiment illustrated in FIG. 11 and are, therefore, not explained.

In the cases shown in FIGS. 14 and 15, there is no formation of a fin on the outward surface of the base 10 so that the structure is neat-looking and involves no waste of material.

It should also be understood that the sealing member need not be cylindrical as illustrated but may for example be conical, frustoconical or hexagonal.

Furthermore, the heating means need not be a heat sealer tip such as the one illustrated but may be a soft beam, for instance, and of course such alternative heating means can be applied to the other embodiments as well.

Figure 16:
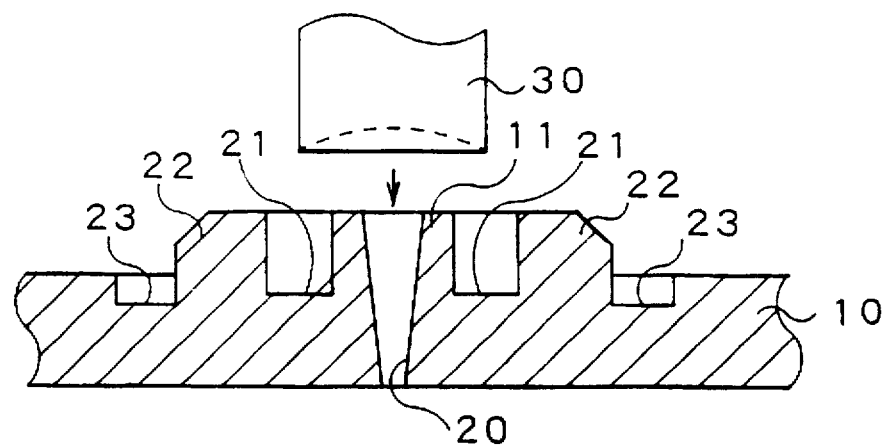
FIG. 16 is a cross-sectional view, on exaggerated scale, of the heat seal structure according to a seventh embodiment prior to heat sealing.
Figure 17:
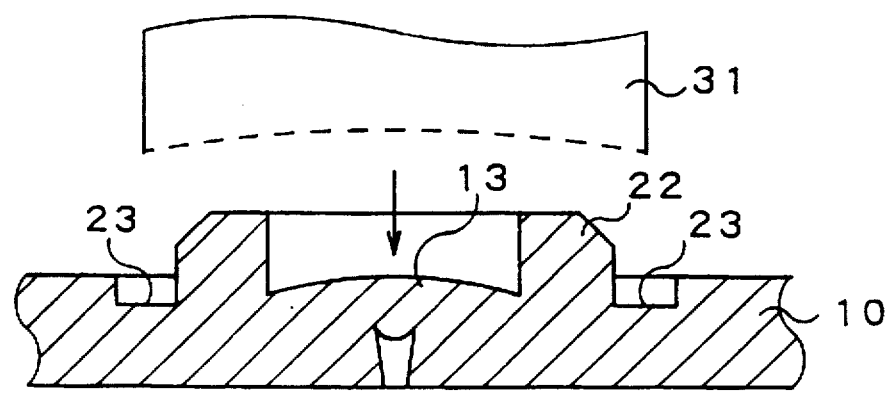
FIG. 17 is a cross-sectional view, on exaggerated scale, of the heat seal structure according to a seventh embodiment in the process of heat sealing.
Figure 18:
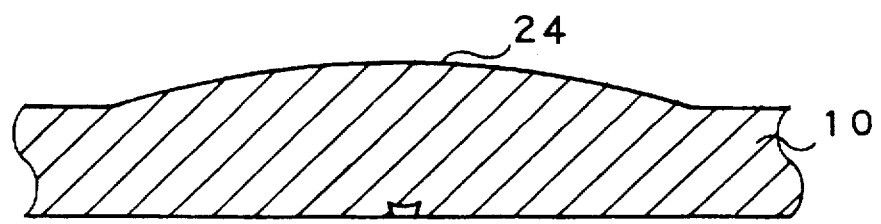
FIG. 18 is a cross-sectional view, on exaggerated scale, of the heat seal structure according to the seventh embodiment after heat sealing.

FIGS. 16 through 18 show the seventh embodiment of this invention wherein a double seal structure is realized.

Thus, the base 10 not only has an outwardly extending projection 11 having a gas vent 20 of generally V-shaped, outwardly expanding cross section but also has an annular projection 22 around the projection 11 in concentric relation, with annular grooves 21 and 23 being formed between the projection 11 and annular projection 22 and around the root of the annular projection 22, respectively.

In accordance with this seventh embodiment, the heat sealer tip 30 is pressed against the projection 11 to form a seal 13 closing the gas vent 20 and, then, a second heat sealer tip 31 is pressed against the annular projection 22 to form a seal 24 to further seal the gas vent 20.

Since the annular groove 23 is provided in this embodiment, there is no formation of a fin on the outward side of the base 10 nor is there electrical trouble due to the detachment of the fin 6b.

Figure 19:
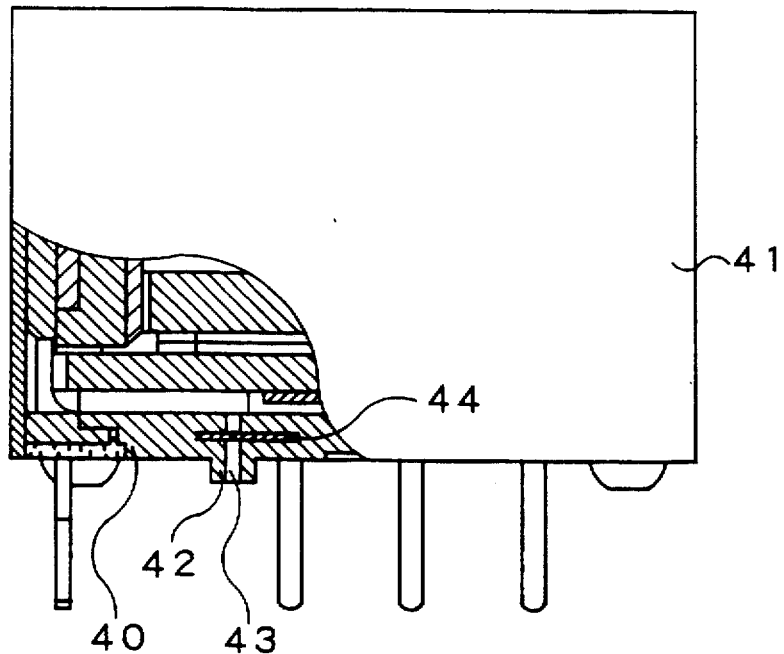
FIG. 19 is a fragmentary section view of an eighth embodiment of the invention as applied to a relay.

Referring, now, to FIGS. 19 and through 21 which show a sealed relay comprising a synthetic resin base 40 carrying internal relay components and a case 41 fitted to the base. The base 40 has a gas vent 43 running is through a projection 42 and base 40 and a terminal lead frame 44 as insert-molded in such a manner that the gas vent 43 is interrupted by the lead frame, the lead frame 44 having a through-hole 45 communicating with the gas vent 43 and having a diameter smaller than the diameter of the gas vent 43.

In this arrangement, as a heat sealer tip not shown is pressed against said projection 42, a portion of the resin of the projection 42 melted and flowing into said gas vent 43 is intercepted by said lead frame 44 to fill up the gas vent, thus effecting a hermetic seal.

In accordance with this embodiment, the majority of the resin of the projection 42 melted fills up the gas vent 43 without hanging down to form a pendant fin as it is the case with the prior art so that a thick solid seal 46 is obtained.

Figure 22:
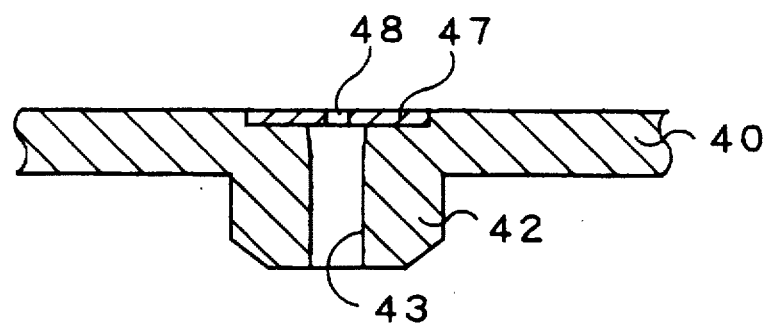
FIG. 22 is a cross-sectional view, on exaggerated scale, of the heat seal structure according to a ninth embodiment prior to heat sealing.
Figure 23:
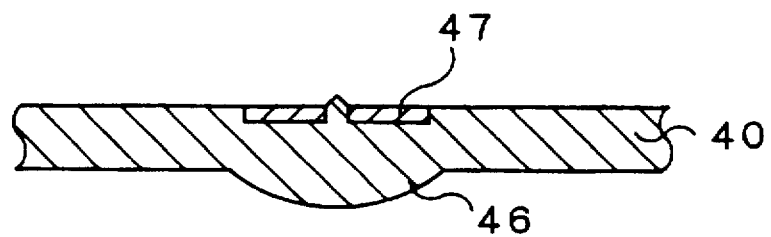
FIG. 23 is a cross-sectional view, on exaggerated scale, of the heat seal structure according to the ninth embodiment after heat sealing.

The ninth embodiment of this invention is illustrated in FIGS. 22 and 23. Whereas the lead frame 44 is utilized as a sealing member in the eighth embodiment described above, a sealing member 47 independent of a lead frame is insert-molded on the inward side of the base 40. This sealing member 47 is a generally circular disk insert-molded in concentric relation to the gas vent 43 to cover the inward aperture of the vent 43 and having a central through-hole 48 whose diameter is smaller than the diameter of the vent 43.

In this arrangement, a portion of the projection 42 is melted by a heat sealer tip not shown flows into the vent 43 to fill it up just as in the ninth embodiment and further plugs up the through-hole 48 of the sealing member to effect a hermetic seal. The other details of this embodiment are similar to those of the eight embodiment and are, therefore, not explained.

It should be understood that in any of the embodiments described above, the through-hole need not be circular nor need be a hole made in the sealing member but may for example be a notch made in the sealing member that communicates with the gas vent.

Figure 24:
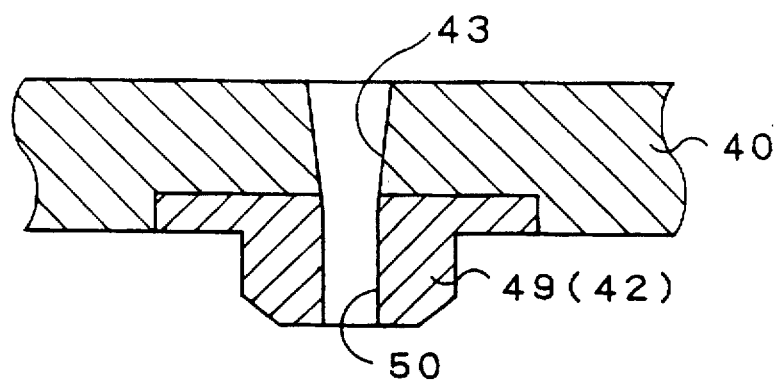
FIG. 24 is a cross-sectional view, on exaggerated scale, of the heat seal structure according to a tenth embodiment prior to heat sealing.
Figure 25:
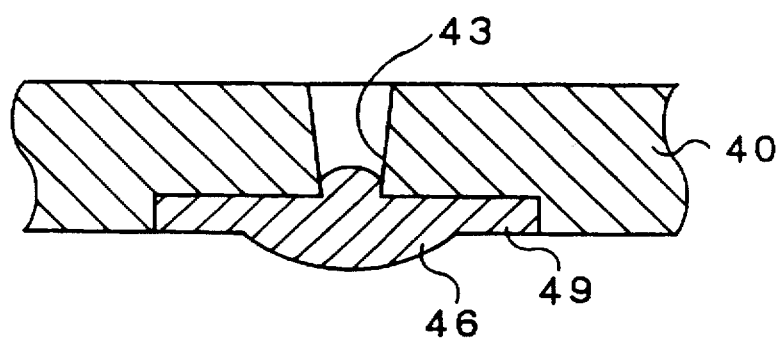
FIG. 25 is a cross-sectional view, on exaggerated scale, of the heat seal structure according to the tenth embodiment after heat sealing.
Figure 26:
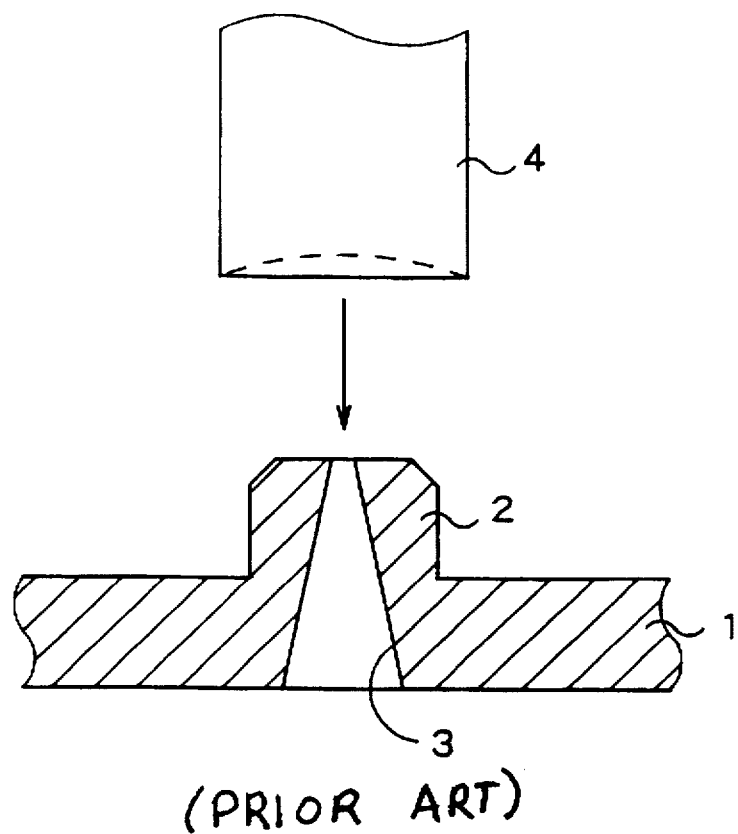
FIG. 26 is a cross-sectional view, on exaggerated scale, of a conventional heat seal structure prior to heat sealing.
Figure 27:
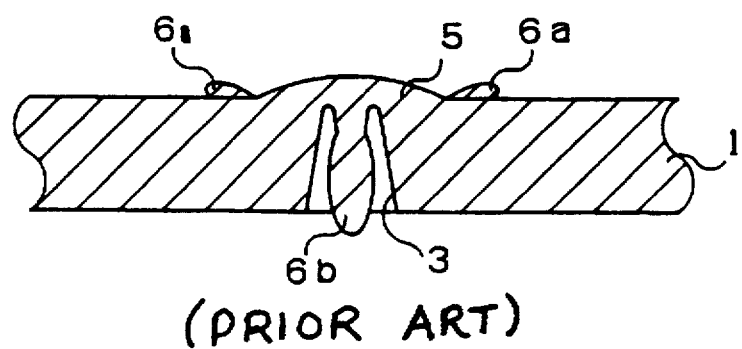
FIG. 27 is a cross-sectional view, on exaggerated scale, of the heat seal structure of FIG. 26 after heat sealing.
Figure 28:
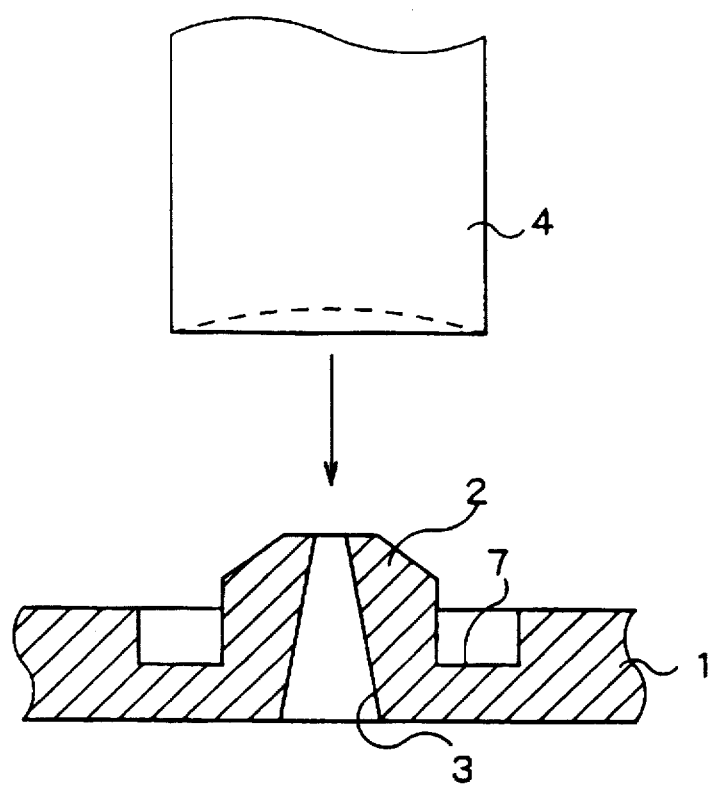
FIG. 28 is a cross-sectional view, on exaggerated scale, showing another conventional heat seal structure and prior to heat sealing.

The tenth embodiment of this invention is illustrated in FIGS. 24 and 25. Whereas a seal is effected by partial melting of the base 40 in the above embodiment, the sealing member 49 is melted to effect a seal in this tenth embodiment.

Thus, a sealing member 49 having a T-shaped cross section and made of a synthetic resin melting at a lower temperature compared with the melting point of the resin constituting the base 40 is insert-molded on the bottom side of the base 40 in such a manner that its axial through-hole 50 communicates with the gas vent 43 of the base 40, with its vertical segment 42 projecting out from the bottom of the base.

In this arrangement, as a heat sealer tip (not shown) is pressed against the sealing member 49 to cause a portion of the sealing member 49 to melt and flow into the through-hole 50, the gas vent 43 is plugged up to effect a hermetic seal. The other details of this embodiment are similar to those of the preceding embodiment and are, therefore, not explained.

In this embodiment, the vertical segment 42 of the sealing member 49 is made of a synthetic resin melting at a temperature lower than the melting point of the resin constituting the base 40 so that the former is relatively ready to melt and solidify. Therefore, even through a portion of the vertical segment 42 melted finds its way into the gas vent 43, it does not form a hanging fin and solidifies in a short time.

It should be understood that while the through-hole is described as being a straight or tapered hole, it may have any other suitable configuration.

Figure 29:
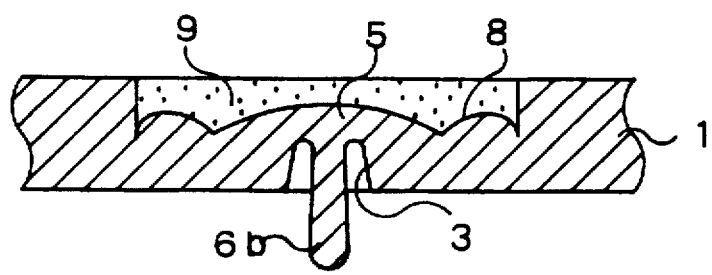
FIG. 29, is [an elementary] a cross-sectional view, on exaggerated scale, of the conventional heat seal structure of FIG. 28 after heat sealing.

Particularly when the gas vent has a tapered wall expanding in the outward direction, the flow of molten resin is rendered smooth and there is no formation of the fin 6a (FIG. 29) inevitable to the conventional seal so that not only the appearance of the seal is improved but also troubles due to detachment of the fin 6a are precluded.

It should be understood that although several embodiments of this invention have been described with reference to a sealed relay, this invention can of course be applied to other electrical devices such as switches.

In the first through the third embodiments described hereinbefore, all the molten resin flows down the tapered wall defining the gas vent so that the flow rate is somewhat lower than that in the conventional heat seal system. As a consequence, all the molten resin fills up and solidifies in the gas vent so that there is no formation of a pendant fin which is inevitable to the conventional system. Therefore, compared with the conventional seal, a more solid, effective seal is obtained.

The increased thickness of the seal reduces the variation in sealing effect and, therefore, the positional accuracy of the heat sealer tip need not be so high. This means that the time required for sealer tip positioning is reduced and, hence, the productivity is increased.

Furthermore, the absence of a pendant fin results in a reduced incidence of malfunction due to detachment of the fin.

Particularly in the third embodiment, the projection disposed around the outward aperture of the gas vent is first melted and caused to flow into the gas vent so that even when the positional accuracy of the heat sealer tip is low, a solid seal is obtained without fail. This means a reduced sealer positioning time and, hence, a further improvement in productivity.

In the fourth and fifth embodiments of this invention, either the sealing member or the solidified sealing composition prevents hanging of molten resin so that the resin fills up the gas vent completely to provide a solid hermetic seal. Therefore, just as in the first through third embodiments, a reduced variation in sealing effect, high productivity, and a reduced incidence of malfunction are obtained.

In the sixth embodiment where the sealing member is made of a synthetic resin which melts at a temperature below the melting point of the synthetic resin constituting the base, this sealing member is more ready to melt and solidify. Therefore, the molten resin of the sealing member flowing into the gas vent solidifies there in a short time to close up the vent. As a consequence, there is no formation of a pendant fin which is inevitable to the conventional sealing system and a solid seal is obtained. This insures no variation in sealing effect, a reduced positioning accuracy of the heat sealer tip required, hence an improvement in productivity, and no malfunction associated with detachment of the pendant fin.

In accordance with the seventh embodiment, the projection and the surrounding annular projection are respectively melted and solidify to provide a solid double seal. This means a reduced variation in sealing effect, a reduced positional accuracy of the heat sealer tip required, and an improvement in productivity.

In the eighth embodiment of this invention wherein the sealing member is molded integrally with the base in a position traversing the gas vent, the seal structure has a high mechanical strength. Moreover, since the molten resin of the projection fills up the gas vent completely, a solid hermetic seal is obtained. Therefore, even if the seal structure is subjected to an external thermal stress, the seal is not destroyed but a high sealing effect is maintained.

Furthermore, in the eight embodiment of this invention, closure of the through-hole in the sealing member results in a seal of the gas vent so that the amount of resin required for sealing is reduced as compared with the conventional structure. As a consequence, the positional accuracy of the hat sealer tip need not be so critical, with the result that the heat sealing operation becomes less time-consuming, thus contributing to improved productivity.

Furthermore, the molten resin flowing down the gas vent is intercepted by the sealing member so that there is no formation of a fin which is inevitable to the conventional heat seal system and, therefore, malfunctions associated with detachment of the fin are precluded.

In the ninth embodiment, the sealing member having a through-hole is molded integrally across the aperture of the gas vent so that the gas vent and through-hole are closed up thoroughly so that a high sealing effect can be realized with high productivity and the risk of malfunction is avoided.

In the tenth embodiment of the invention wherein the sealing projection is made of a synthetic resin which melts at a temperature below the melting point of the resin constituting the base, the projection is more ready to melt and, then, solidify. Therefore, even when a portion of molten synthetic resin finds its way into the gas vent, it solidifies in a short time so that there is no formation of a pendant central fin. Furthermore, the vent is filled up to provide a solid hermetic seal. Therefore, there is no variation in sealing effect nor a malfunction due to detachment of a fin 6b. Furthermore, since the sealing projection is made of a synthetic resin with a relatively low melting point, the projection is ready to melt to close up the gas vent even when the heat sealer tip is not so accurately positioned. This reduced positioning accuracy requirement contributes to improved productivity.

Thus, in accordance with any of the eighth through tenth embodiments, it is not necessary to use a sealing agent for a double seal so that compared with the conventional double seal structure, the number of production steps is reduced and, yet, an effective seal is implemented with higher productivity.

Other embodiments are within the scope of the following claims.

What is claimed is:

1. A heat seal structure comprising a base of synthetic resin formed integrally with an outwardly extending projection with a gas vent running through said base and said projection, said projection being meltable to seal off said gas vent, and a sealing member which is a lead frame molded integrally with said base in a position traversing said gas vent and providing a through-hole disposed to communicate with said gas vent and being smaller than said gas vent in cross-sectional area, said through-hole of said sealing member being sealable upon thermable melting of said projection.

* * * * *